United States Patent [19]

Smith

[11] Patent Number: 4,743,867
[45] Date of Patent: May 10, 1988

[54] COMPENSATION CIRCUITRY FOR DUAL PORT PHASE-LOCKED LOOPS

[75] Inventor: Joe M. Smith, Scottsdale, Ariz.

[73] Assignee: Motorola, Inc., Schaumburg, Ill.

[21] Appl. No.: 80,936

[22] Filed: Aug. 3, 1987

[51] Int. Cl.[4] .......................... H03C 3/08; H03C 3/09; H03L 7/08
[52] U.S. Cl. .................................... 332/16 R; 332/18; 332/19; 331/16; 331/17; 331/25; 331/179; 455/260
[58] Field of Search ......................... 332/16 R, 18, 19; 331/10, 16, 17, 25, 179; 375/81, 120; 455/76, 77, 87, 113, 205, 208, 214, 260, 337

[56] References Cited

U.S. PATENT DOCUMENTS 4,568,888 2/1986 Kimura et al. ................... 331/10

OTHER PUBLICATIONS daSilva, Marcus; "Synthesis of FM Signals", r.f. design, Sep./Oct. 1984, pp. 29-38.

Primary Examiner—Eugene R. LaRoche
Assistant Examiner—David C. Mis
Attorney, Agent, or Firm—Maurice J. Jones

[57] ABSTRACT

Phase port gain compensating circuitry is coupled to the phase modulation summing circuit and voltage controlled oscillator (VCO) gain compensating circuitry is coupled to the frequency control terminal of the VCO. Compensator control circuitry utilizes divider ratio control information to control the characteristics of the two compensators to compensate for otherwise undesirable effects on the phase-locked loop response parameters caused by changes in the divider ratio and in the VCO gain.

15 Claims, 3 Drawing Sheets

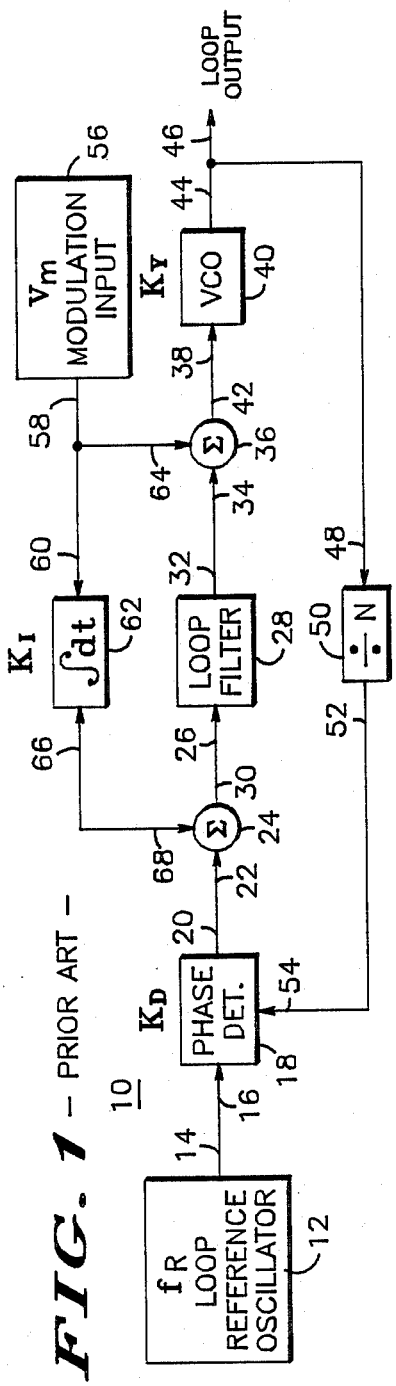
FIG. 1 — PRIOR ART —
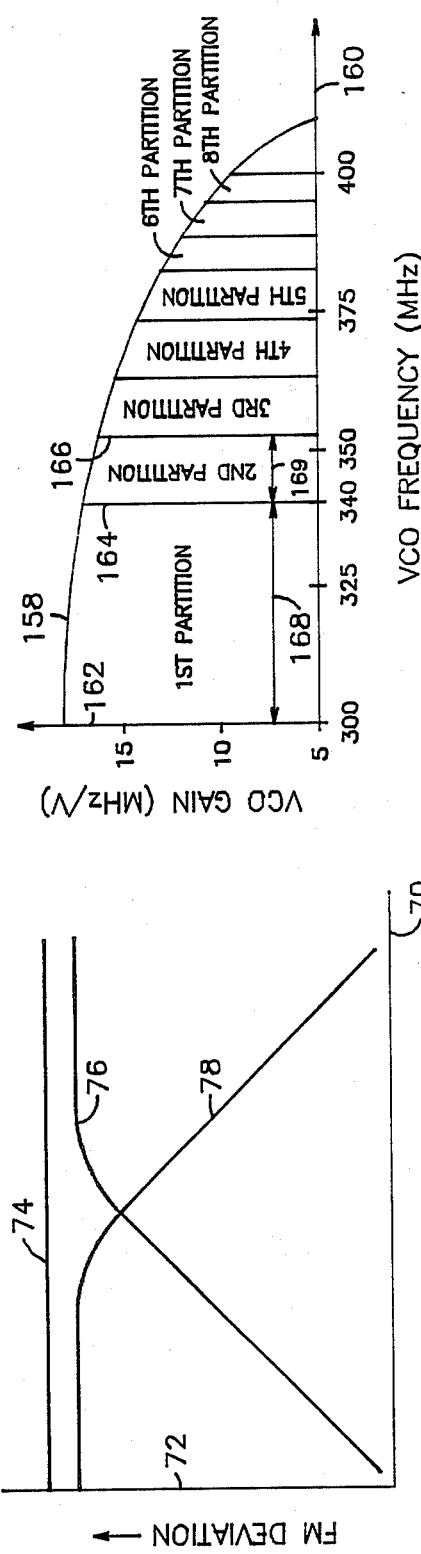
FIG. 4
FIG. 2 — PRIOR ART —

COMPENSATION CIRCUITRY FOR DUAL PORT PHASE-LOCKED LOOPS

BACKGROUND OF THE INVENTION

Phase-locked loops are widely used for many applications in modern receivers, transmitters, and transceivers. Such circuitry is sometimes utilized in a transceiver to provide a local oscillator signal when the transceiver is in the receive mode and to provide a modulated signal for transmission when the transceiver is in the transmit mode.

More specifically, a commonly used prior art phase-locked loop (PLL) includes a phase detector having an output coupled through a loop filter to control the frequency of a voltage controlled oscillator (VCO). Some of the output of the VCO is fed back through a divide-by-N circuit to a first input of the phase detector. A constant reference frequency signal is applied to a second input of the phase detector by a crystal oscillator, for instance.

The frequency of the VCO output signal is changed by changing "N" of the divide-by-N circuit. For example, if the reference oscillator is operating at 5 Megahertz ($MH_z$) and N=100, the VCO would provide a loop output signal of 500 $MH_z$. This signal is divided by 100 to provide a 5 $MH_z$ feedback signal to the phase detector which is compared with the 5 $MH_z$ reference oscillator signal. The phase difference between these signals is filtered by the loop filter to provide a control signal to adjust the frequency and hence the phase of the VCO to eliminate the phase difference. If N is changed to 99 then the VCO would provide an output signal having a frequency of 495 $MH_z$. Therefore, this type of prior art PLL circuitry is useful for providing output signals having any one of a number of discrete output frequencies which are multiples of the frequency of the reference oscillator and which substantially have the frequency stability of the crystal reference oscillator.

The foregoing PLL configuration can be used as a frequency modulator by adding a summation circuit between the loop filter and the VCO which combines the control signal from the loop filter with a modulating information signal to provide a composite control signal to the VCO. Thus, the frequency of the output signal of the VCO is modulated or deviated in response to the amplitude of the information signal to provide a frequency modulated (FM) output signal. It is necessary for the modulation frequency to be outside of the loop bandwidth of this prior art PLL. Otherwise, the PLL will treat the modulation as noise and try to eliminate it. Therefore, this prior art modulator configuration is unsuitable for many applications requiring that the loop bandwidth include the modulation frequency to meet settling time or noise elimination requirements.

One prior art solution to the settling time problem is to use a narrow loop bandwidth PLL which uses bandwidth switching circuitry to reduce settling time. This bandwidth switching circuitry unfortunately performs in a satisfactory manner only in applications requiring a moderate increase in loop bandwidth of less than 10 times.

Another sometimes simpler prior art solution to the foregoing bandwidth problem has been to utilize a dual port modulation PLL circuit which allows modulation rates at frequencies within the loop bandwidth. Such circuitry overcomes the limitations of modulation frequencies within the loop bandwidth by applying modulation at both a VCO summing port connected between the loop filter and VCO and through an integrating filter to an additional phase summing port connected between the output of the phase detector and the loop filter. The VCO provides a low pass operating characteristic in response to the phase port modulation and a high pass characteristic in response to the VCO port modulation. If the phase port modulation is combined with the VCO port modulation at the correct amplitude and phase, the overall FM operating characteristic is "flat" over the VCO frequency range, as will subsequently be explained in more detail. This technique works well in applications where the VCO gain and the divide-by-N ratio, N are constant such as in single center frequency or narrow VCO bandwidth applications. However, this prior art configuration is not suitable for applications which require wide VCO bandwidths such as those employed in modern military and transceivers which require synthesizers that can be switched to move or "hop" between a plurality of frequencies over a wide bandwidth in a predetermined manner. This is because the divider ratio, N and the VCO gain change considerably over the required wide VCO operating range. These changes in VCO gain and N cause a corresponding variation in the modulation frequency response and loop bandwidth so that the frequency deviation of the modulated output signal tends to undesirably vary with the frequency of the modulating signal and therefore is not flat or constant with changes in modulation frequency. The changes in loop bandwidth provide an undesirable effect on settling time and the changes in modulation response provide an undesired effect on the frequency deviation of the VCO.

SUMMARY OF THE INVENTION

An object of the invention is to provide an improved PLL.

Another object of an aspect of the invention is to provide an improved PLL modulator having dual port modulation.

Still another object of another aspect of the invention is to provide a dual port, PLL modulator which has a wide loop bandwidth, responds to low modulation frequencies and is rapidly switchable between a large number of preselected frequencies in a predetermined manner over a wide band while providing FM deviation which remains constant with changes in the frequency of the modulating signal.

Briefly, a dual port PLL in accordance with one embodiment of the invention includes a phase port gain compensator coupled between the phase detector and the phase modulation summing circuit and a VCO gain compensator coupled between the frequency modulation summing circuit and the control terminal of the VCO. Moreover, compensator control circuitry includes at least one output terminal connected to a control terminal of the phase port gain compensator and to a control terminal of the VCO gain compensator, and a control terminal connected to receive the divider ratio control signal which is also applied to the programmable divide-by-N circuit of the PLL.

The phase port gain compensator includes a plurality of circuit legs each having a circuit element and an electronically controlled switch. The electronically controlled switches of the phase port gain compensator responds to control signals provided thereto by the compensator control circuit to selectively couple in particular circuit elements between the output of the phase detector and the input of the phase modulation summing circuit to compensate for otherwise undesirable variations in the PLL caused by changes in the divider ratio of the divide-by-N circuit. The VCO gain compensator circuit also includes a plurality of circuit legs each having a circuit element and an electronically controlled switch which selectively couples the circuit elements to the VCO control terminal in response to control signals from the compensator control circuitry to thereby compensate for undesirable changes in the VCO gain which otherwise would occur when the VCO changes frequency in response to changes in the divider ratio. As a result, undesirable effects on the modulation characteristic of the VCO and on the bandwidth of the PLL which otherwise would occur as the divider ratio is changed over large values are reduced or eliminated.

BRIEF DESCRIPTION OF THE DRAWINGS

A more complete understanding of the present invention may be derived by reference to the detailed description and the claims when considered along with the accompanying drawings wherein like reference numbers designate similar parts.

FIG. 1 is a block diagram of a prior art dual port PLL modulator;

FIG. 2 is a graph of output signal FM deviation versus input signal modulation frequency for illustrating some aspects of the operation of the dual port modulator of FIG. 1;

FIG. 4 is a graph illustrating the partitioning of the VCO gain compensator of FIG. 3.

DETAILED DESCRIPTION OF THE PREFERRED EMBODIMENT

Figure 3:
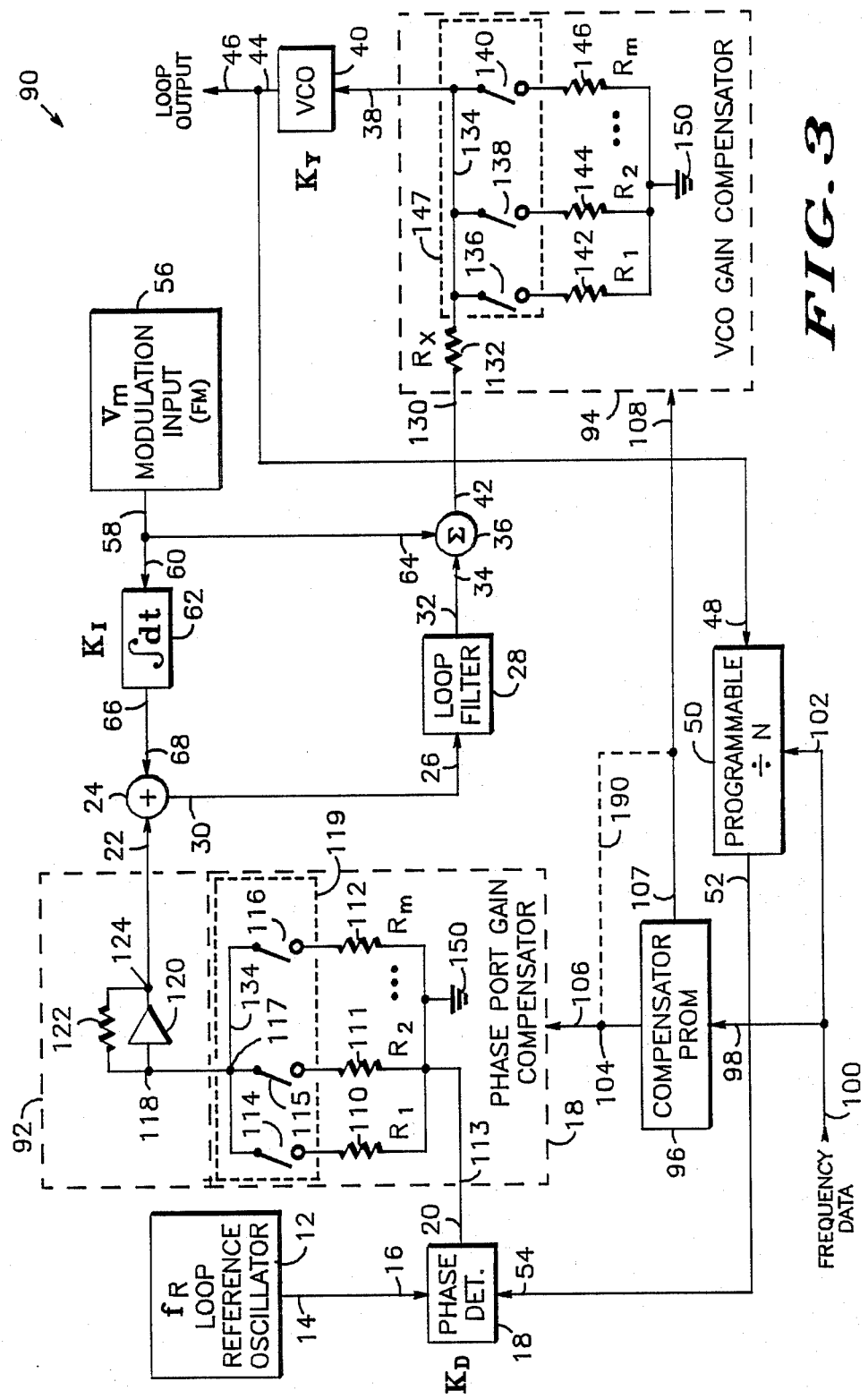
FIG. 3 is a block and partial schematic diagram of a dual port PLL modulator which is compensated in accordance with one embodiment of the invention.

FIG. 1 is a block diagram of a prior art, uncompensated dual port PLL 10 which is operable as either a FM modulator or a receiver local oscillator, for instance. Reference crystal oscillator 12 provides a stable, sinusoidal reference signal at output terminal 14 thereof which is connected to one input terminal 16 of phase detector 18. Output terminal 20 of phase detector 18 is connected to input terminal 22 of phase modulation port summing circuit 24. Input terminal 26 of loop filter 28 is connected to output terminal 30 of summing circuit 24. Output terminal 32 of loop filter 28 is connected to input terminal 34 of VCO FM port summing circuit 36. Control terminal 38 of VCO 40 is connected to output terminal 42 of summing circuit 36. Output terminal 44 of VCO 40 is coupled to PLL output terminal 46 and to input terminal 48 of divide-by-N circuit 50. Output terminal 52 of divide-by-N circuit 50 is connected to input terminal 54 of phase detector 18. Output terminal 58 of modulation signal supply 56 is coupled to input terminal 60 of integrator 62 and to input terminal 64 of summing circuit 36. Output terminal 66 of integrator 62 is connected to input terminal 68 of summing circuit 24.

When PLL 10 is operated as a modulator it is desirable for the change in frequency or deviation of the output signal at PLL output terminal 46 to vary in proportion to the instantaneous amplitude of the modulating signal delivered by circuit 56 and that the frequency of the PLL output signal at terminal 46 not vary with the frequency of the modulating signal. More specifically, FIG. 2 represents modulation frequency along abscissa axis 70 and frequency deviation along ordinate axis 72. If the deviation of the output signal at terminal 46 does not vary with the variation in the frequency of the modulating signal at terminal 58 then circuit 10 would have the desirable characteristic indicated by horizontal line 74 and PLL 10 is said to have a "flat" frequency modulation deviation response versus modulation frequency.

A simplified analysis of how dual port modulator 10 achieves an extended modulation range as compared to single port modulators is also shown in FIG. 2. Curve 76 shows the high pass response of VCO 40 in response to the frequency of the modulating signal at input terminal 64 of summing circuit 36. Curve 78 shows the low pass response of VCO 40 to the modulating signal at input terminal 60 of the integrator when the modulation signal at terminal 64 of summing circuit 36 is removed. Provided that the amplitude and phase of each of the signals at terminals 64 and 68 are correctly adjusted, the composite dual port response is indicated by straight line 74. The correct signal amplitude at each of terminals 64 and 68 is obtained by adjusting the loop gain constants of PLL 10 such that the following relationship of equation 1 is satisfied:

$$K_I = \frac{K_V K_D}{N} \tag{1}$$

where
$K_I$ = integrator gain
$K_V$ = VCO gain
N = divider ratio
$K_D$ = phase detector gain As a result, input signals to terminal 68 of summing circuit 24 and to terminal 64 of summing circuit 36 can be theoretically adjusted in amplitude and phase such that the resulting modulation response 74 extends to a modulation frequency of zero as shown in FIG. 2. Physical limitations of circuitry 10 such as offset currents in integrator 62 and the finite range limit of phase detector 18 limit the actual obtainable low frequency response to greater than zero. The net result is that dual port modulator 10 will have a modulation response which will extend well below the loop bandwidth of the PLL. This has the advantage of allowing modulation at low rates even though the loop of PLL 10 has a wide bandwidth extending below the modulation rate. In comparison, a single port modulator in which modulation is provided only to VCO summing circuit 36, and which does not include phase port summing circuit 24 or integrator 62, will only effectively modulate at rates greater than the loop bandwidth. Modulation frequencies falling within the loop bandwidth will be tracked out in a single port modulator.

A major problem with prior art PLL 10 is that if any of the gains in the loop change there will tend to be a resulting undesirable change in the modulation characteristic in addition to an undesirable change in the loop bandwidth. Some present day communication systems require PLLs which operate over wide radio frequency ranges in predetermined manners such as those required of "frequency hopping" transceivers. In these applications both the divider ratio, N and the VCO gain, $K_V$ of equation 1 will vary considerably thus resulting in undesirable changes in the deviation with modulation frequency and in loop bandwidth.

FIG. 3, which uses the same reference numbers as FIG. 1 for corresponding parts, shows PLL circuit 90 of one embodiment of the invention. PLL 90 compensates for variations in modulation response and loop bandwidth due to the changes in divider ratio N, and in VCO gain, $K_V$, caused when PLL 90 is operated over a multiplicity of frequencies. PLL 90 includes phase port gain compensator circuit 92 which is coupled between output terminal 20 of phase detector 18 as shown and input terminal 22 of summing circuit 24. PLL 90 further includes VCO gain compensator circuit 94 which is coupled between output terminal 42 of summing circuit 36 and control terminal 38 of VCO 40. In some applications, utilizing linearized versions of VCO 40, it will not be necessary to include VCO gain compensator 94 in PLL 90.

In addition, PLL 90 includes compensator control, programmable read only memory (PROM) 96 having a control terminal 98 which is connected to frequency control conductor 100. This PROM can be a 2K by 8 EPROM such as the 27C16 sold by several semiconductor suppliers. Programmable divide-by-N circuit 50 includes a control terminal 102 which is also connected to conductor 100. Compensator PROM 96 has an output terminal 104 which is coupled to control terminal 106 of phase port gain compensator 92 and another output terminal 107 which is coupled to control terminal 108 of VCO gain compensator 94.

Phase port compensator 92 includes a plurality of circuit elements such as resistors, for example 110, 111, and 112 having terminals connected to compensator input terminal 113 and other terminals respectively connected to terminals of a group of normally open switches, for example 114, 115 and 116. A resistor such as 110 and a switch such as 114 form a circuit leg. Other terminals of each of the group of switches is connected to node 117. Switches 114, 115 and 116 may be electronically controlled solid state switches provided by an integrated circuit 119 such as the MC14051 which is sold by Motorola. Node 117 is connected to input terminal 118 of operational amplifier 120. Feedback resistor 122 is connected between output terminal 124 of amplifier 120 and input terminal 118. Amplifier output terminal 124 is connected to input terminal 22 of summing circuit 24. Feedback resistor 122 cooperates with the resistance coupled to node 117 and amplifier 120 to enable compensator 92 to provide a predetermined gain which varies with the resistance of the particular resistor or resistors coupled to node 117.

VCO gain compensator circuit 94 includes an input terminal 130 connected thru input resistor 132 to node 134. A group of electronically controlled switches which may include switches 136, 138 and 140 are connected between node 134 and terminals of respective resistors 142, 144 and 146. Such switches may also be included in an integrated circuit 147 such as the MC14051. Ground or reference potential conductor 150 is connected to another terminal of resistors 142, 144 and 146. Node 134 is also connected to frequency control terminal 38 of VCO 40. Resistor 132 forms a voltage divider with the resistance of the particular resistor or resistors coupled to node 134 to provide a particular gain.

Circuits 119 and 147 of compensators 92 and 94 are controlled or programmed by digital control signals from PROM 96 which is programmed to operate in response to the frequency control data on conductor 100 supplied to divide-by-N counter 50. More specifically, compensator PROM 96 uses the divide-by-N frequency data to generate a digital control signal at output terminal 104 which selectively operates to close one of switches 114, 115 or 116 of compensator 92 to selectively connect one of resistors 114, 115 or 116 to amplifier 120 of phase port compensator 92. Also, PROM 96 provides another digital control signal at output terminal 107 which closes one of switches 136, 138 or 140 of VCO port compensator 94 to selectively connect one of resistors 142, 144 or 146 to input terminal 38 of VCO 40 to control the gain of compensator 94.

PROM 96 partitions the frequency band of PLL 90 into a plurality of segments for phase port compensator 92 and for VCO port compensator 94 in response to the frequency control data on conductor 100. In each of these segments a resistor is selected by the analog switch in each of compensators 92 and 94 to provide the desired gain compensation.

Resistor values in phase port compensator 92 are chosen such that they increase linearly with N to compensate for divide-by-N gain variations. Mathematically this can be expressed as follows:

$$\frac{R_J}{R_1} = \frac{N_1}{N_J} \qquad (2)$$

Where
$R_1$ = value of the resistor connected during the first interval which is chosen to provide the necessary loop bandwidth over the first interval;
$N_J$ = average division ratio in the Jth interval: where J is any interval except the first;
$N_1$ = average division ratio in the first interval; and
$R_J$ = value of the resistor connected during the Jth interval.

Resistor values for VCO port compensator 94 are chosen such that the compensator gain varies inversely to VCO gain. Mathematically this can be expressed as follows:

$$\frac{G(J)}{G(1)} = \frac{K_V(1)}{K_V(J)} \qquad (3)$$

Where
G (J) = VCO port compensator gain in the Jth interval;
G (1) = VCO port compensator gain in the first interval;
Kv (J) = average VCO gain over Jth interval; and
Kv (1) = average VCO gain over first interval.
G (J) and G (L) can be related to the component values shown in compensator 94 of FIG. 3 as follows:

$$G(J) = \frac{R_J}{R_J + R_x} \qquad (4)$$

where
$R_J$ = value of the resistor connected during the Jth interval
$R_x$ = value of resistor 132
and $$G(1) = \frac{R_1}{R_1 + R_x} \qquad (5)$$

FIG. 4 depicts a typical VCO compensator curve 158 where VCO frequency is shown along the abscissa axis 160 and the VCO gain is indicated along ordinate axis 162. Each partition line such as 164 corresponds to a VCO frequency along axis 160 at which PROM 50 switches to another of resistors such as resistors 142, 144 or 146. Resistor 142 may be connected by closing switch 136 during first partition 168 from 300 MHz to 340 MHz, for instance. The number of resistors included in compensator 94 corresponds to the number of partitions of the desired frequency range. FIG. 4 indicates eight partitions for a VCO frequency range of 300 MHz to 400 MHz. Thus, compensator 94 would include eight resistors in addition to resistor 132.

The intervals or partitions, for example 168 and 169, as measured along axis 160 are not generally equal in frequency range or spacing. These intervals are chosen such that the percentage change in VCO gain is equal for each interval as measured along ordinate axis 162. This requires more closely spaced partition lines for higher values of N or VCO frequency as indicated in FIG. 4.

Figure 5:
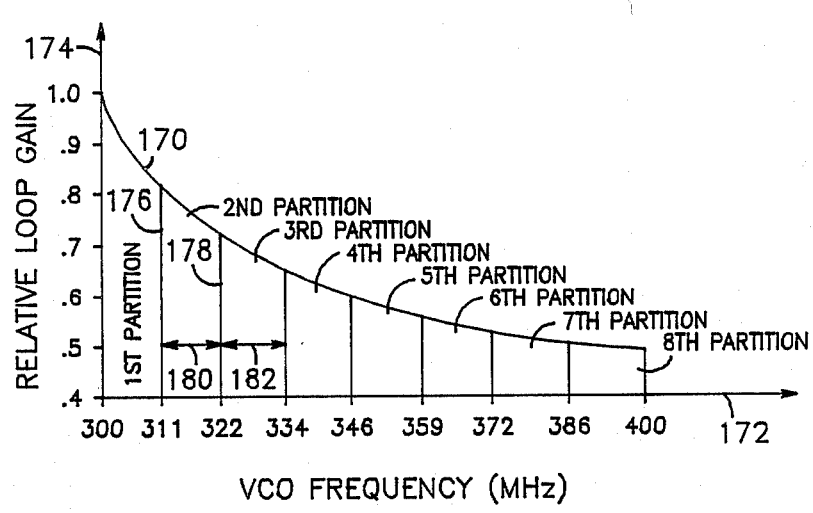
FIG. 5 is a graph illustrating the partitioning of the phase port gain compensator of FIG. 3.

FIG. 5 depicts phase port compensator partition curve 170. VCO frequency is shown along abscissa axis 172 and the relative loop gain of PLL 90 is shown along ordinate axis 174. As in FIG. 4, each partition line such as 176 corresponds to a VCO frequency along axis 172 at which PROM 50 provides a control signal to 119 which switches to another of resistors such as 114, 115 or 116. Since FIG. 5 indicates eight partitions, eight resistors would be included between phase detector 30 and analog switch 119.

The partition lines such as 176 and 178, for instance, as measured along axis 172 are again not equally spaced. The partitions such as 180 and 182 of FIG. 5 as measured along axis 172, are generally not aligned with the partitions of FIG. 4. The partition lines of FIG. 5 tend to be relatively further apart for higher values of VCO frequency as indicated.

It is possible, as a special case, for the partition lines of FIGS. 4 and 5 to correspond to the same VCO frequencies along axes 160 and 172 so that the partitions of compensators 92 and 94 are the same. In this case, compromises might have to be made in VCO compensation to achieve simplification of the programming of PROM 96, for instance. Also, in this case compensator PROM output terminal 107 could be eliminated and control terminal 108 could be connected to PROM output terminal 104 as indicated by dashed conductor line 190 of FIG. 3.

Some typical values follow for the eight switchable resistors for phase port compensator 92 corresponding to each of the eight partitions from 300 to 400 MHz of the VCO frequency range of axis 172 shown in FIG. 5, where K equals kilohms:

$R_1 = 46.4K$
$R_2 = 42.2K$
$R_3 = 38.3K$
$R_4 = 34.8K$
$R_5 = 34.8K$
$R_6 = 32.4K$
$R_7 = 32.4K$
$R_8 = 32.4K$

Moreover, some typical values follow for the eight switchable resistors of VCO port compensator 94 for the eight partitions of the 300 to 400 MHz VCO range along axis 160 of FIG. 4 wherein the resistance of resistance of resistor 132 equals 5.11 kilohms:

$R_1 = 3.48K$
$R_2 = 3.48K$
$R_3 = 3.32K$
$R_4 = 3.83K$
$R_5 = 4.75K$
$R_6 = 6.04K$
$R_7 = 7.5K$
$R_8 = 10K$

An improved PLL modulator 90 having dual port modulation compensation has been described. Utilization of phase port modulator compensator 92 and VCO gain compensator 94 enable PLL 90 to provide a wide loop bandwidth which is responsive to low modulation frequencies down to 10 Hz and to be rapidly switchable between a large number of preselected frequencies over a wide band such as 200 MHz to 400 MHz while providing FM deviation which tends to remain constant even though the frequency of the modulating signal changes. Compensators 92, 94 and PROM 96 can be reliably, easily and inexpensively implemented since they can include integrated circuits.

While the invention has been particularly shown and described with reference to preferred embodiments, those skilled in the art will understand that changes in form and details may occur therein without departing from the scope of the present invention.

I claim:

1. A dual port phase-locked loop including a phase detector having an output terminal, a phase modulation summing circuit having a first input terminal for receiving phase modulation, a second input terminal and an output terminal, a frequency modulation summing circuit having an input terminal for receiving frequency modulation and an output terminal, a voltage controlled oscillator circuit having a control terminal and a divide-by-N circuit providing a changeable divider ratio, wherein the improvement comprises:

phase port gain compensator means having input, control and output terminals, said input terminal of said phase port gain compensator means being coupled to the output terminal of the phase detector, said output terminal of said phase port gain compensator means being coupled to the second input terminal of the phase modulation summing circuit;

compensator control means having a control terminal and at least one output terminal, said output terminal of said compensator control means being coupled to said control terminal of said phase port gain compensator means; and conductive means coupled to said control terminal of said compensator control means for providing first control signals thereto, said compensator control means being responsive to said first control signals to provide second control signals to said phase port gain compensator means which responds to said second control signals to compensate the phase-locked loop for undesirable changes therein otherwise caused by changes in the divider ratio.

2. The dual port phase-locked loop of claim 1 wherein said phase port gain compensator means includes a plurality of circuit legs each having a circuit element and an electronically controlled switch means, said circuit element and said electronically controlled switch means being coupled together.

3. The dual port phase-locked loop circuit of claim 2 wherein said phase port gain compensator means further includes amplifier means having input and output terminals, each of said circuit legs being coupled between said input terminal of said phase port gain compensator means and said input terminal of said amplifier means, said output terminal of said amplifier means being coupled to the second input terminal of the phase modulation summing circuit, said electronically controlled switch means being responsive to said second control signals from said compensator control means to selectively couple various ones of said circuit elements to said amplifier means to compensate for otherwise undesirable effects caused by changes in the divider ratio.

4. The dual port phase-locked loop of claim 1 further including:
   voltage controlled oscillator gain compensator means having input, output and control terminals, said input terminal of said voltage controlled gain compensator means being coupled to the output terminal of the frequency modulation summing circuit, and said output terminal of said voltage controlled oscillator gain compensator means being coupled to the control terminal of the voltage controlled oscillator; and
   an output terminal of said compensator control means being coupled to said control terminal of said voltage controlled oscillator gain compensator means, and said compensator control means providing control signals to said voltage controlled oscillator gain compensator means which responds to said control signals to compensate the phase-locked loop for otherwise undesirable changes therein.

5. The dual port phase-locked loop of claim 4 wherein said control terminal of said voltage controlled gain compensator means receives said second control signals from said compensator control means.

6. A dual port phase-locked loop including a phase detector having an output terminal, a phase modulation summing circuit having a first input terminal for receiving phase modulation, a second input terminal and an output terminal, a frequency modulation summing circuit having an input terminal for receiving frequency modulation an output terminal, a voltage controlled oscillator circuit having a control terminal and a divide-by-N circuit providing a changeable divider ratio, wherein the improvement comprises:
   phase port gain compensator means having an input terminal, a control terminal and an output terminal, said input terminal of said phase port gain compensator means being coupled to the output terminal of the phase detector, said output terminal of said phase port gain compensator means being coupled to the second input terminal of the phase modulation summing circuit;
   voltage controlled oscillator gain compensator means having an input terminal, an output terminal and a control terminal, said input terminal of said voltage controlled gain compensator means being coupled to the output terminal of the frequency modulation summing circuit, and said output terminal of said voltage controlled oscillator gain compensator means being coupled to the control terminal of the voltage controlled oscillator;
   compensator control means having a control terminal, a first output terminal, and a second output terminal, said first output terminal of said compensator control means being coupled to said control terminal of said phase port gain compensator means, said second output terminal of said compensator control means being coupled to said control terminal of said voltage controlled oscillator gain compensator means; and
   conductive means coupled to said control terminal of said compensator control means for providing first control signals thereto, said compensator control means being responsive to said first control signals to provide second control signals to said phase port gain compensator which responds to said second control signals to compensate the phase-locked loop for undesirable changes therein otherwise caused by changes in the divider ratio, and said compensator control means being responsive to said first control signals to provide third control signals to said voltage controlled oscillator gain compensator means which responds to said third control signals to compensate the phase-locked loop for otherwise undesirable changes therein caused by the voltage controlled oscillator.

7. The dual port phase-locked loop of claim 6 wherein said phase port gain compensator means includes a plurality of circuit legs each having a circuit element and electronically controlled switch means.

8. The dual port phase-locked loop circuit of claim 7 wherein said phase port gain compensator further includes amplifier means having an input terminal and an output terminal, each of said circuit legs being connected between said input terminal of said phase port gain compensator means and said input terminal of said amplifier means, said output terminal of said amplifier means being coupled to the phase modulation summing circuit, said electronically controlled switch means being responsive to said second control signals from said compensator control means to selectively couple various ones of said circuit elements to said amplifier means to compensate for the otherwise undesirable effects caused by said changes in the divider ratio.

9. The dual port phase-locked loop circuit of claim 8 wherein said circuit elements include resistive means.

10. The dual port phase-locked loop circuit of claim 6 wherein said voltage controlled oscillator gain compensator means includes a plurality of circuit legs each including electronically controlled switch means and a circuit element.

11. The dual port phase-locked loop circuit of claim 10 wherein said voltage controlled oscillator gain compensator means further includes:
   input resistive means having an input terminal and an output terminal, said input terminal of said input resistive means being connected to said output terminal of the frequency modulation summing circuit;
   conductive means adapted to provide a reference potential; and
   each of said circuit legs being connected in parallel between said output terminal of said input resistive means and said conductive means.

12. The dual port phase-locked loop circuit of claim 10 wherein said circuit elements include resistive means.

13. The dual port phase-locked loop of claim 6 wherein said compensator control means further includes a programmable read only memory means.

14. The dual port phase-locked loop circuit of claim 7 wherein said compensator control means further includes programmable read only memory means having an input terminal connected to said conductive means, said programmable read only memory means responding to said first control signals to provide first digital signals at said first output terminal thereof for activating said electronically controlled switch means in said phase port gain compensator, said programmable read only memory means responding to said first control signals to provide second digital controls signal at said second output terminal thereof for activating said electronically controlled switch means in said voltage controlled oscillator gain compensator means.

15. The dual port phase-locked loop circuit of claim 10 wherein said compensator control means further includes programmable read only memory means having an input terminal connected to said conductive means, said programmable read only memory means responding to said first control signals to provide first digital signals at said first output terminal thereof for activating said electronically controlled switch means in said phase port gain compensator, said programmable read only memory means responding to said first control signals to provide second digital controls signal at said second output terminal thereof for activating said electronically controlled switch means in said voltage controlled oscillator gain compensator means.

* * * * *